United States Patent [19]

Yamamoto et al.

[11] Patent Number: 4,854,495
[45] Date of Patent: Aug. 8, 1989

[54] SEALING STRUCTURE, METHOD OF SOLDERING AND PROCESS FOR PREPARING SEALING STRUCTURE

[75] Inventors: Akihiko Yamamoto; Akiomi Kohno; Toshihiri Yamada; Motohiro Satou; Keiji Taguchi; Kazuaki Yokoi, all of Ibaraki, Japan

[73] Assignee: Hitachi, Ltd., Tokyo, Japan

[21] Appl. No.: 63,419

[22] Filed: Jun. 18, 1987

[30] Foreign Application Priority Data

Jun. 20, 1986 [JP] Japan .............................. 61-143033
Jul. 15, 1986 [JP] Japan .............................. 61-164612
Aug. 27, 1986 [JP] Japan .............................. 61-198844

[51] Int. Cl.$^4$ .............................................. B23K 1/03
[52] U.S. Cl. ..................................... 228/124; 228/208; 228/263.12; 228/263.17; 228/263.16; 220/2.3 R
[58] Field of Search ................... 228/124, 263.12, 208, 228/209, 210, 263.16, 263.17, 121; 403/272, 179; 220/2.1 R, 2.3 R

[56] References Cited

U.S. PATENT DOCUMENTS

| | | | |
|---|---|---|---|
| 3,213,532 | 10/1985 | Glaser et al. | 228/208 X |
| 3,394,451 | 7/1968 | Stuart | 228/124 |
| 3,473,216 | 10/1969 | Webb | 228/208 |
| 3,893,224 | 7/1975 | Besson | 228/124 |
| 4,602,731 | 7/1986 | Dockus | 228/124 X |
| 4,699,310 | 10/1987 | Kohno et al. | 228/263.12 |
| 4,749,118 | 6/1988 | Yokoi et al. | 228/263.12 |

FOREIGN PATENT DOCUMENTS 1082179 5/1960 Fed. Rep. of Germany .................. 228/263.12

Primary Examiner—Kenneth J. Ramsey
Attorney, Agent, or Firm—Antonelli, Terry & Wands

[57] ABSTRACT

This invention discloses a method of soldering together at least two members selected form metals and ceramics, which comprises successively jointing a high-melting jointig material, a medium-melting jointing material, and a low-melting jointing material, and a sealing structure prepared by this method.

The method according to present invention enables the preparation of a sealing structure having a soldered area which is excellent in tightness.

31 Claims, 3 Drawing Sheets

FIG. 1
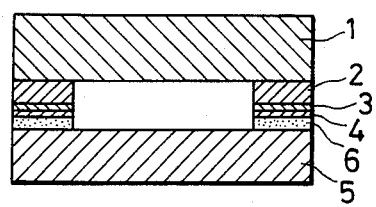
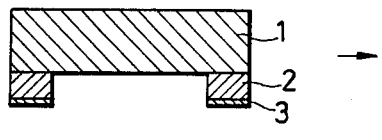 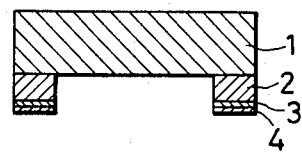
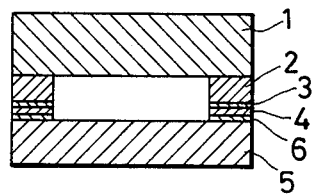
FIG. 3 FIG. 4
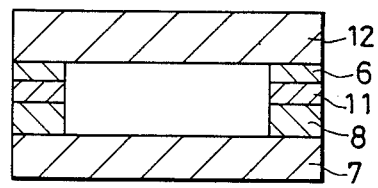 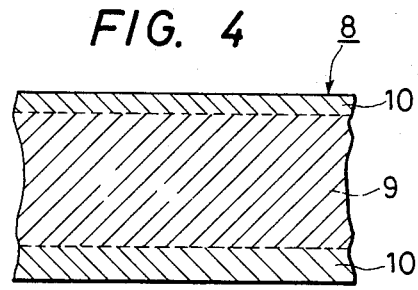

SEALING STRUCTURE, METHOD OF SOLDERING AND PROCESS FOR PREPARING SEALING STRUCTURE

BACKGROUND OF THE INVENTION

1. Field of the Invention

This invention relates to a sealing structure, a method of soldering and a process for preparing a sealing structure. More particularly, the present invention is concerned with a soldering technique which can simplify surface treatmentn of ceramic and is suitable for use in the field of electronic components, semiconductor components, etc. where soldering of ceramic and metal is desired.

2. Description of the Prior Art

Known methods of soldering metal and ceramic include (1) a method typified by the polybdenum-manganese (mo-Mn) process or copper sulfide process, which comprises coating the surface of ceramic with metallic powder through baking (metallization) and plating the metallized portion with nickel (Ni) followed by gold (Au), or chromium (Cr) followed by nickel and then gold to thereby facilitate soldering and (2) a method which comprises soldering metal and glass or oxide ceramic using a solder comprising lead-tin (Pb-Sn) as the main component and zinc (Zn), antimony (Sb), silicon (Si), titanium (Ti), beryllium (Be) and rare earth elements added thereto.

Also, a sealing structure for sealing electronic components, for example, which is formed by soldering a square casing composed of a ceramic member with one side thereof opened, and a board, is known.

The above-mentioned soldering methods have the following drawbacks. Since the former method requires metallizing treatment of the ceramic, strict control of the atmosphere for metallization and plating treatment after the metallization are indispensable. Further, this method has limitations due to the complexity of procedures and also tends to cause defects such as pore formation on the metallized surface. In the latter method, the ceramic which can be used is limited to glass and oxide ceramic, and no satisfactory result can be attained with respect to the soldering of non-oxide ceramic, e.g., silicon carbide (SiC) or silicon nitride ($Si_3N_4$), and metal.

Meanwhile, in the above-mentioned sealing technique, a square casing with one side thereof opened is formed of a single ceramic member. Therefore, when the provision of projections within the casing is intended in order to release heat generated from electronic components, great difficulties are encountered in fabricating projections within the casing. Even if the projections are successfully provided within the casing, their shapes are limited to simple ones. In this sealing technique, the edge portion of the casing is plated with nickel (Ni) or gold (An) and soldered to the ceramic board, thereby forming a sealing structure.

SUMMARY OF THE INVENTION

Object of the Invention

An object of the present invention is to provide a sealing structure which requies neither a metallizing layer nor a plating layer, a process for preparing the same and a method of soldering which can eliminate the need of metallizing and plating treatments.

Another object of the present invention is to provide a process for preparing a sealing structure comprising three sections, which enables easy fabrication of projections on the portion corresponding to the top board of the casing, easy repair and replacement of electronic components contained within the sealing structure and easy separation of the frame from the ceramic member on the board side and rejointing thereof.

Statement of the Invention

In accordance with a first aspect of the present invention, there is provided a sealing structure comprising a first board made of a material selected from ceramic and metal, a second board also made of a material selected from ceramic and metal, and a jointing member which seals the peripheral spece between the first and second boards.

The jointing member comprises a first layer selected from an aluminum layer and an aluminum alloy layer, a second layer having a melting point lower than that of the first layer, and a solder layer having a melting point lower than that of the second layer.

In accordance with a second aspect of the present invention, there is provided a sealing structure comprising a first board made of a material selected from ceramic and metal, a second board also made of a material selected from ceramic and metal, a metallic frame located in the peripheral space between the first and second boards, a first jointing member which seals a peripheral space between the frame and said first board, and a second jointing member which seals a peripheral space between the frame and the second board.

The first jointing member comprises at least a first layer selected from an aluminum layer and an aluminum alloy layer, a second layer having a melting point lower than that of the first layer, and a solder layer having a melting point lower than that of the second layer.

In accordance with a third aspect of the present invention, there is provided a method of soldering at least two members selected from ceramic and metal together.

This method heating and jointing aluminum and/or aluminum alloy to one of the two members, heating and jointing a material selected from among zinc, zinc alloy, magnesium and magnesium alloy to the surface of the aluminum and/or aluminum alloy, and soldering the other member thereto.

In accordance with a fourth aspect of the present invention, there is provided a process for preparing a sealing structure comprising two ceramic members opposed to each other and a frame jointed to each of the ceramic members.

This process a step of jointing one of the two ceramic members to one side of the frame with a first high-melting jointing material and jointing a second high-melting jointing material to the other side of the frame, a step of jointing a medium-melting jointing material, which melts at a lower temperature than the first and second high-melting jointing materials, to the surface of the second high-melting jointing material which has been jointed to the other side of the frame, and a step of jointing the medium-melting jointing material to the other ceramic member of the two ceramic members opposed to each other with a low-melting jointing material which melts at a lower temperature than the medium-melting jointing material.

Boards to be Jointed

The boards to be jointed in the present invention are ceramics and metals. The present invention is effective in jointing ceramic to metal by means of a solder. Further, the present invention can also be applied to the jointing of metals or ceramics to each other.

The ceramic board material is selected from among silicon carbide (SiC), sialon, silicon nitride ($Si_3N_4$), aluminum nitride (AlN), aluminum oxide ($Al_2O_3$), mullite, and nberyllium oxide (BeO). When ceramics are jointed to each other by soldering using a frame which will be mentioned later, it is preferred that one of the ceramic board materials be selected from among silicon carbide, aluminum nitride and beryllium oxide, and the other ceramic material be selected from aluminum oxide and mullite.

The metallic board material is selected from among iron (Fe), molybdenum (Mo), tungsten (W), copper (Cu), hard metals, for example. Examples of the hard metals include tungsten carbide-cobalt (WC-Co) alloy, and tungsten carbide-nickel (WC-Ni) alloy.

Jointing Member

The jointing members which may be used in the present invention are comprised mainly of three layers. The first layer is a high-melting jointing material layer comprising an aluminum layer and/or an aluminum alloy layer. The second layer to be superimposed on the first layer is a medium-melting jointing material layer having a melting point lower than that of the first layer. The third layer to be supeimposed on the second layer is a low-melting jointing material layer having a melting point lower than that of the second layer. In other words, the present inventio is characterized by successively jointing a high-melting layer and a medium-melting layer to one of the boards to be jointed and finally jointing the other board to be jointed to the medium-melting layer with a low-melting layer.

The first layer may be a single layer comprising a pure aluminum layer or an aluminum alloy layer, or a composite layer comprising a combination of an aluminum layer with an aluminum alloy layer superimposed thereon, or a combinatio of aluminum alloy layers. Examples of the aluminum alloy layer which may be applied to the first layer include a layer made of an aluminum-silicon (Al-Si) base alloy, such as aluminum-silicon-magnesium (Al-Si-Mg) alloy or aluminum-silicon-magnesium-bismuth (Al-Si-Mg-Bi) alloy. The Al-Si base alloy may be used in the form of a sheet or powder. Further, the first layer may be in the form of a sheet obtained by laminating the abovementioned Al-Si base alloy as a skin material on at least one surface of a core material comprised of aluminum or an aluminum base alloy. Such a sheet can be easily obtained by applying or spraying powder of the Al-Si base alloy on the surface of the core material. It is preferred that the surface of the first layer to be jointed to the board or frame has an Al-Si base alloy thereon, rather than is in a state in which aluminum is exposed.

The second layer is made of a material selected from among zinc (Zn), zinc base alloy, e.g., Zn-Al base alloy, magnesium (Mg), magnesium base alloy, etc. A representative example of the third layer is one made of a solder. Other materials which may be used in the third layer include tin (Sn), zinc (Zn), tin-lead (Sn-Pb) base alloy, tin-lead-zinc (Sn-PbZn) base alloy, tin-zinc (Sn-Zn) base alloy and lead-zinc (Pb-Zn) base alloy.

The above-mentioned layers, boards, and materials are generally laminated in the following order: ceramic board →first layer (Al-Si base alloy→pure Al layer)-→second layer→solder layer→metallic board; or ceramic board →first layer (comprising a core material comprised of aluminum and/or aluminum alloy layer and, laminated thereon, a surface layer made of an Al-Si base alloy) →frame (which will be mentioned later)-→first layer (comprising the same materials as mentioned above)→second layer→solder layer→ceramic board.

Frame

The material of the frame is selected from among metals and ceramics. Examples of the metals as the frame material include iron, an iron base alloy, molybdenum, a molybdenum base alloy, tungsten, a tungsten base alloy, and a hard metal. Examples of the ceramics as the frame material include SiC, AlN, $Si_3N_4$, sialon, $Al_2O_3$, and $ArO_2$. Examples of the hard metal include those based on tungsten carbide-cobalt (WC-Co), tungsten carbide-nickel (WC-Ni), and tungsten carbide-copper (WC-Cu).

Intermediate Member

When a medium-melting jointing material (second layer) is jointed to the surface of a high-melting jointing material through the provision of an intermediate member having a melting point higher than that of the high-melting jointing material (first layer), it is preferred that the intermediate member be an iron, aluminum or copper material.

Conditions for Heat Jointing

Particularly, in the method of the present invention, heat jointing is preferably conducted by the following two methods:

(1) A ceramic board is jointed to a first layer made of aluminum and/or aluminum base alloy by heating the aluminum and/or aluminum base alloy at a temperature above the solidus temperature. Subsequently, a second layer made of zinc and/or Zn-Al base alloy is jointed to the first layer by heating the zinc and/or Zn-Al base alloy at a temperature above the solidus temperature of the second layer. Thereafter, the second layer is jointed to a metallic board by means of a solder.

(2) A ceramic board is combined with aluminum and/or aluminum base alloy (first layer material) and zinc and/or Zn-Al base alloy (second layer material). Then, the resulting laminate is heated at a temperature above the solidus temperature of the first or second layer material whichever has a higher solidus temperature.

Function

Aluminum or aluminum alloy can be jointed to various ceramics, e.g., oxide ceramics such as $Al_2O_3$ and $ZrO_2$, and non-oxide ceramics such as SiC and $Si_3N_4$. However, since aluminum and aluminum alloy form a strong oxide layer on the surface thereof, the soldering to the surface of aluminum and aluminum alloy is conducted only with great difficulty. It was found that zinc and alloy An-Al base can be easily soldered. Therefore, in the present invention, a zinc-containing layer was formed on the surface of aluminum or aluminum alloy which has been jointed to a ceramic. This enabled easy soldering of ceramic and metal.

Also, it is desired that, in forming a sealing structure from ceramic members opposed to each other and a frame, the sealing of the space between the edge portion of the frame of the casing and the other ceramic member be conducted through soldering. This is because electronic components, for example, contained therein can be repaired and replaced by separating and re-joining the casing at a relatively low temperature. For this reason, the jointing between one of the ceramic members which form a casing and the frame should be conducted using a jointing material which does not melt at the soldering temperature, while the other edge portion of the frame should be pre-treated for easy soldering. In the present invention, the above-mentioned requirements were met by sealing the frame and the other ceramic member with a solder (low-melting jointing material) by adopting a pretreatment method owhich comprises jointing one of the ceramic members to one of the edge portions of the frame with a high-melting jointing material comprised of aluminum or aluminum alloy, jointing a high-melting jointing material to the other edge portion of the frame and jointing a medium-melting jointing material comprised of zinc or Zn-Al base alloy on the surface thereof.

BRIEF DESCRIPTION OF THE DRAWINGS

FIG. 1 is a cross-sectional view of one form of a sealing structure according to the present invention;

FIGS. 2a to 2c comprise a diagrammatic view illustrating a process for preparing the sealing structure as shown in FIG. 1;

FIG. 3 is a cross-sectional view of another form of a sealing structure according to the present invention;

FIG. 4 is a cross-sectional view of the high-melting jointing material of the sealing structure as shown in FIG. 3;

EXAMPLE 1

Figure 5:
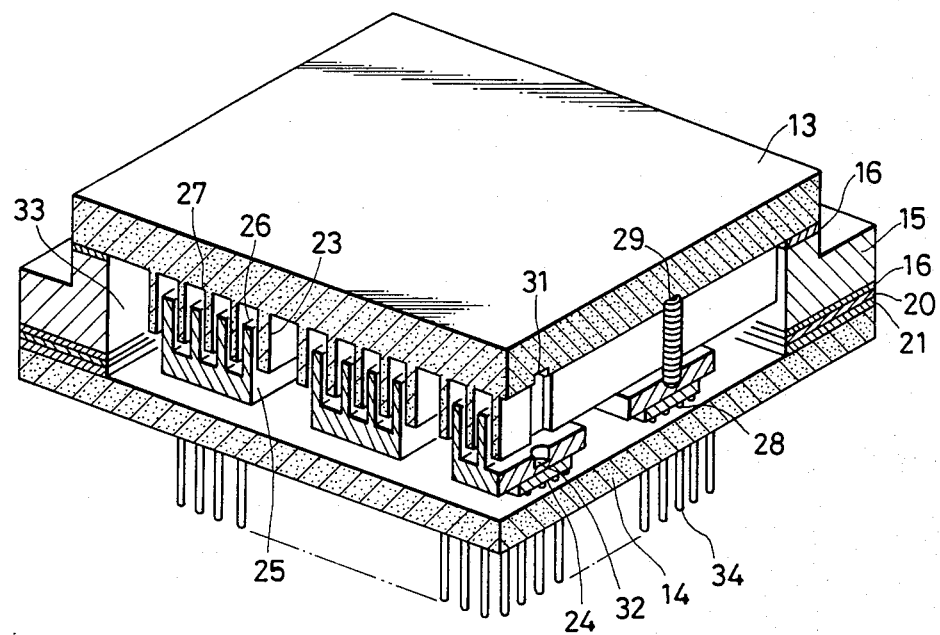
FIG. 5 is a partially cutaway perspective view of a semiconductor-mounting sealing structure to which the present invention has been applied.

Soldering of silicon carbide and copper:

FIG. 1 shows a cross-sectional view of a sealing structure. The sealing structure as shown in FIG. 1 comprises a disc 1 made of silicon carbide, a three-layer sheet 2 comprising a core material comprised of aluminum alloy and a skin material comprised of aluminum-silicon-magnesium alloy and provided on the both surfaces of the core material, a pure aluminum layer 3, a zinc-aluminum alloy layer 4, and a copper layer 5 which has been jointed with solder 6. The sealing structure as shown in FIG. 1 is prepared by the method of jointing as shown in FIG. 2. First, the disc 1 made of silicon carbide and sheet 2 and pure aluminum layer 3 are jointed to each other by keeping them in vacuo (2 to $3 \times 10^{-4}$ Torr or less) at 600° C. for 10 min. Subsequently, the pure aluminum layer 3, which has been jointed, and the zinc-aluminum alloy layer 4 are heated in air at a temperature above the solidus temperature of the zinc-aluminum alloy, e.g., at 400° C. followed by pressing the zinc-aluminum layer 4 against the pure aluminum layer 3, thereby jointing them to each other. They are allowed to cool. The zinc-aluminum alloy layer 4 is jointed to the copper layer5 using the solder layer 6. When disc 1 made of silicon carbide is jointed to the pure aluminum layer 3 through the sheet 2, both skin materials, each made of aluminum-silicon-magnesium alloy, of the sheet 2 is melted at 585° C., which causes aluminum and silicon to be jointed to not only pure aluminum but also silicon carbide. In this jointing, the application of pressure (0.1 to 2 kgf/mm$^2$) further improves the jointability. In the case of the jointing between the pure aluminum layer 3 and the zinc-aluminum alloy layer 4, the eutectic temperature of the zinc-aluminum alloy is about 382° C., and the heating above that temperature brings about the melting of part or the whole of the zinc-aluminum alloy, which leads to the formation of a fresh zinc-aluminum alloy on the surface of the pue aluminum. Once a zinc-aluminum alloy containing zinc is formed on the surface of the pue aluminum, the oxide layer of the zinc-aluminum alloy is easily broken in the melting temperature range of the solder, which enables the soldering. The structure of the cross-section of each jointing area between silicon carbide and copper was observed. As a result, it was found that silica carbide had no cracking due to thermal stress. Further, a helium leakage test revealed that the jointed article had an airtightness of $10^{-8}$ Torr.l/sec or less.

EXAMPLE 2

A jointed article as shown in FIG. 2 (b) was prepared by heating and pressing each layer in an argon atmosphere (1 atm) at a temperature of 600° C. and a pressure of 2 kgf/mm$^2$ for 10 min, thereby simultaneously jointing each layer. The jointed article was allowed to cool, followed by the soldering of the ceramic and the metal. In the helium leakage test, the resulting sealing structure exhibited the same airtightness as that obtained in Example 1.

As is apparent from Examples 1 and 2, a ceramic can be soldered to a metal by jointing a ceramic to aluminum or aluminum alloy and jointing zinc or Zn-Al base alloy to the aluminum or aluminum alloy. Therefore, the following effects can be attained.

(1) The treating temperature can be lowered to 600° C. or below in the steps preceding the soldering of the ceramic and the metal. This reduces the thermal stress generated in the ceramic during cooling. Therefore, the ceramic is less susceptible to cracking, which improves the reliability on strength between the ceramic and aluminum. Further, since aluminum which is inexpensive is used, a remarkable cost reduction can be attained.

(2) The plating treatment for improvement in solderability can be eliminatted, which contributes to remarkable reduction in the number of steps as well as to cost reduction.

(3) The complicated metallizing treatment can be replaced by simple jointing by means of aluminum, which not only facilitates process control but also reduces the number of the steps required.

EXAMPLE 3

In order to metallize a ceramic, a 25 mm-square silicon carbide plate 7 having a thickness of 1 mm was used as a ceramic, as shown in FIG. 3. A 0.6 mm-thick aluminum alloy brazing sheet 8 comprising a core material 9 comprised of aluminum-manganese alloy and clad materials 10 each comprised of aluminum-10% silicon-2% magnesium alloy was used as the aluminum alloy brazing sheet 8 as shown in FIG. 4. A 0.1 mm-thick zinc foil 11 is superimposed on the brazing sheet. They are heated and kept at 600° C. for 30 min under a vacuum of 1 to $3 \times 10^{-1}$ Pa, followed by cooling. On the surface of the zinc foil 11 was superimposed a 25 mm-square copper plate 12 having a thickness of 0.5 mm through a 0.2 mm-thick solder foil 6 made of 60% tin-40% Pb alloy, followed by soldering in air at 200° C. The surface layer portion of the brazing sheet 8 comprised a mixed structure composed of a silicon phase, an aluminum phase and a zinc phase. The zinc phase and the solder were sufficiently melted and dispersed, and a zinc-lead eutectic structure was observed in the tin phase of the brazing sheet 8. Further, no void was observed in the aluminum phase and zinc phase or solder interface, and excellent jointed areas were obtained. With respect to the soldering portion, it was found that tin was dispersed in the aluminum brazing sheet 8, which caused the reduction in the amount of a tin-lead eutectic mixture, i.e., both were sufficiently melted and dispersed. Further, a copper-tin alloy layer was formed and jointed in the interface between the copper plate and the solder. Under the same conditions as mentioned above, a copper wire having a diameter of 1 mm was jointed through soldering and applied to a tensile test. As a result, the strength was found to be 3 kgf/mm$^2$. In order to examine the jointing strength of the silicon carbide interface, the above-mentioed brazing sheet was interposed between round rods having a diameter of 10 mm and made of silicon carbide, followed by jointing under the same conditions as mentioned above. The bending strength of the resulting jointed article was a high as 6 kgf/mm$^2$.

Although zinc was used as the medium-melting metal in the above-example, the same effect can also be attained by tin-lead base alloy, tin-lead-zinc base alloy, tin-zinc base alloy, and lead-zinc base alloy. With respect to the atmosphere, the same effect can be attained in an atmosphere of inert gas such as argon or nitrogen, or reducing atmosphere. Further, with respect to he ceramics, the same effect can be attained by other ceramics regardless of the type, e.g., oxide or non-oxide ceramics.

According to the present example, the metallization of a ceramic with aluminum and the jointing between the portion metallized with aluminum and a different material through soldering can be simplified, which not only enables the production of a strong jointed articla having less thermal stress but also eliminates the need for plating treatment which has been conventionally required in soldering.

EXAMPLE 4

Figure 6:
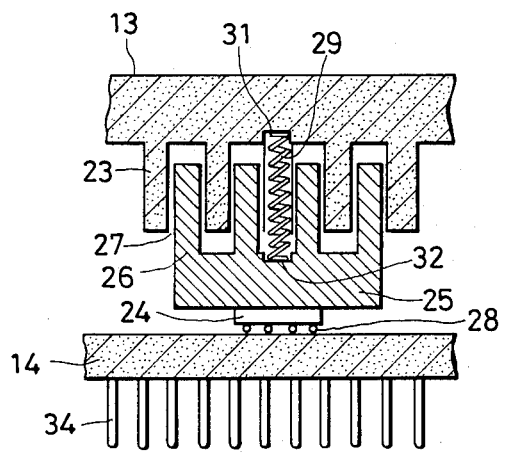
FIG. 6 is a partly enlarged cross-sectional view of the sealing structure as shown in FIG. 5.

FIG. 5 is a partially cutaway perspective view of a sealing structure illustrating one mode of the process for preparing a sealing structure according to the present invention, and FIG. 6 is a partial cross-sectional view of the sealing structure as shown in FIG. 5. Numerals 13 and 14 designate ceramicmembers opposed to each other. Electronic components (LSI chips 24) mounted on the ceramic member 14 are fixed with the use of soldering balls 28. The heat generated by the electronic components should be released outside the sealing structure. For this reason, a ceramic member having high thermal conductivity is used as the ceramic member 13 while a ceramic member having excellent insulation characteristics is used as the ceramic member 14. Specifically, silicon carbide, aluminum nitride, beryllium, for example, having high thermal conductivity are used as the ceramic member 13 while aluminum oxide (Al$_2$O$_3$), mullite, for example having excellent insulation characteristics are used as the ceramic member 14.

Numeral 25 designates a thermal conductive material for heat dissipation. It is equipped with a fin 26. The ceramicmember 13 is also equipped with a fin 23. The fin 26 is engaged with the fin 23 while leaving a small gap 27. In order to form a sealing structure, a frame 15 is jointed to each of the opposed ceramic members 13, 14. Since the airtightness of the sealing structure should be adapted to any change in temperature, the thermal expansion coefficient of the frame 15 should be equal to or similar to those of the ceramic members 13, 14. Specifically, examples of the frame material include hard metals such as tungsten carbide-cobalt (WC-Co) alloy, and tungsten carbide-nickel (WC-Ni) alloy, molybdenum (Mo), molybdenum alloy and tungsten (W). The thermal expansion coefficients of these materials are quite similar to those of ceramics.

TABLE 1

| material | | thermal expansion coefficient (*) |
| --- | --- | --- |
| ceramics | SiC | $3.7 \times 10^{-6}/°C.$ |
| | Al$_2$O$_3$ | $7 \times 10^{-6}/°C.$ |
| | mullite | $5 \times 10^{-6}/°C.$ |
| | sialon | $5 \times 10^{-6}/°C.$ |
| | AlN | $4.4 \times 10^{-6}/°C.$ |
| | BeO | $9.5 \times 10^{-6}/°C.$ |
| hard metal | WC—Co | $4.8 \times 10^{-6}/°C.$ |
| | WC—Ni | $6.2 \times 10^{-6}/°C.$ |

In view of the fabricability of the frame 15, an iron (Fe) base metallic material may also be used as the frame material. Thus, a hermetically sealed space 33 is formed. Further a reces 32 is formed in the thermal conductive material 25 while a recess 31 is formed in the ceramic member 13, and a spring 29 is provided between the both recesses. Numeral 34 designate a connecting pin.

Figure 7:
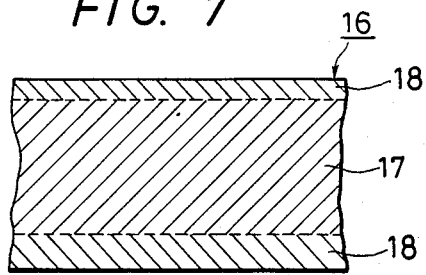
FIGS. 7, 8 and 9 are each a cross-sectional view of a high-melting jointing material which is used in the sealing structure as shown in FIG. 5.
Figure 8:
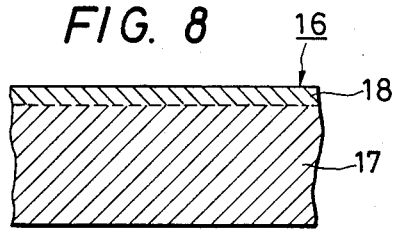
Figure 9:
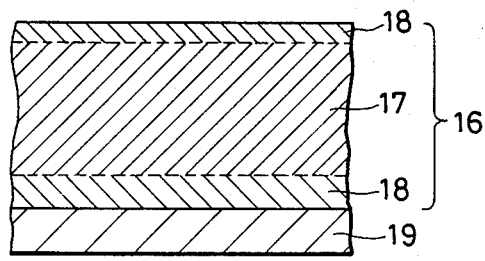

The ceramic member 13 is jointed to one of the jointing faces of the frame 15 using a high-melting jointing material 16. A high-melting jointing material 16 having substantially the same composition as that mentioned above is jointed to the other jointing face of the frame 15. Specifically, as shown in FIGS. 7 and 8, the core material 17 is made of aluminum or aluminum alloy while the skin materials 18 are made of aluminum-silicon (Al-Si) alloy, aluminum-silicon-magnesium (Al-Si-Mg) alloy or aluminum-silicon-magnesium-bismuth (Al-Si-Mg-Bi) alloy. The high-melting jointing material 16 having a structure as shown in FIG. 7 is provided between the ceramic member 13 and the frame 15. On the other hand, the jointing material for provision on the other jointing face of the frame 15 is a high-melting jointing material having a structure as shown in FIG. 8 or a high-melting jointing material having a structure as shown in FIG. 9 and obtained by providing an intermediate material 19, made of aluminum, aluminum base alloy, copper or copper base alloy, on one surface of the high-melting jointing material having a structure as shown in FIG. 7. The high-melting jointing material 16 having a structure as shown in FIG. 7 is used when jointing is conducted on the both surfaces, while the high-melting jointing material 16 having a structure as shown in FIG. 8 when jointing is conducted on one surface.

Subsequently, zinc or zinc-aluminum base alloy is jointed as a medium-melting jointing material on the surface of the high-melting jointing material 16 (or intermediate member 19) of the frame remote from the side of the ceramic member 13. The medium-melting jointing material 20 is a jointing material which melts at a lower temperature than the high-melting jointing material and can be easily jointed to aluminum, aluminum base alloy, copper or coppe base alloy as well as to a solder. The intermediate member to be provided may be made of an iron base metallic material.

Thereafter, the ceramic member 14 is jointed to medium-melting jointing material 20 using a solder as the low-melting jointing material 21. The above-mentioned high-melting jointing material, medium-melting jointing material and low-melting jointing material may be those selected by mutual comparison of the three materials in such a manner that differences in melting points, required for the operation, are recognized among the three materials. Therefore, the magnitude of the melting temperature of each material is not meaningful. Specifically, the temperature difference is such that, when the ceramic member 14 is heated for separation, the ceramic member 1 can be separated at a low temperature enoug to melt the jointing material 21 without causing the melting of the jointing materials 16, 20. When the difference in melting temperature between the jointing materials 16, 20 and the jointing material 21 is small, there is a risk of the jointing material 16 being also melted when the jointing material 21 is melted. Therefore, in order to prevent such an unfavorable phenomenon, it is necessary to take into consideration the melting temperatures of the three materials in selecting the jointing materials. A further improvement in airtightness can be attained by using a ceramic member which has been metallized before the frame is jointed to the ceramic member 14.

As mentioned above, various ceramics can be used as the ceramic members 13, 14. Further, various hard metals, molybdenum, molybdenum alloy, tungsten, iron base metallic materials and ceramics can be used as the frame 15. The combination of these materials are summarized in Table 2.

TABLE 2

| Sample No. | Ceramic member 13 | Jointing material 16 | Frame 15 |
|---|---|---|---|
| 1 | | | WC—Co |
| 2 | | high-temp. | WC—Ni |
| 3 | SiC | jointing | SiC |
| 4 | | material | sialon |
| 5 | | (type as | Al₂O₃ |
| 6 | | shown in | AlN |
| 7 | | FIG. 6) | |
| 8 | AlN | | |
| 9 | | | " |
| 10 | BeO | | |
| 11 | | | |
| 12 | | | |

| Jointing member 16 | Jointing member 20 | Jointing member 21 | Ceramic 14 |
|---|---|---|---|
| high-melting jointing material (type as shown in FIG. 7 or FIG. 8) | medium-melting jointing material (Zn, Al—Zn alloy) | low-melting jointing material (solder) | Al₂O₃ mullite |

EXAMPLE 5

The present example is related to sample No. 1 of Table 2.

In jointing ceramic member 13 (75 mm×75 mm×3 mm) comprising silicon carbide to a frame 15 comprising tungsten carbide-cobalt alloy, the following materials were used. A high-melting jointing material 16, as shown in FIG. 7, comprising a core material 17 comprised of an aluminum-1.3% manganese alloy and skin materials 18 each comprised of aluminum-10% silicon-2% magnesium alloy (plate thickness: 0.6 mm; and thickness of skin material (one side): 0.06 mm) was used as the high-melting jointing material 16. With respect to a high-melting jointing material to be superimposed on the other surface of the frame 15, a high-melting jointing material, as shown in FIG. 8, comprising a core material 17 comprised of aluminum-1.3% manganese alloy and a skin material 18 comprised of aluminum-10% silicon-2% manganese alloy (plate thickness: 0.6 mm; skin material thickness: 0.06 mm) was used. These materials were assembled, heated and kept in vacuo (about $10^{-4}$ Torr) at a jointing temperature of 610° C. and a pressure of 0.2 kgf/mm² for 15 min. Since the skin material 18 of the high-melting jointing material 16 had a melting point of about 580° C., the skin material 18 melted at 610° C. and reacted with silicon carbide and tungsten carbide-cobalt alloy, causing jointing. At this time, the core material 17 was not in a molten state and, at the same time, the pressure was low as mentioned above. Therefore, the degree of the shrinkage in the pressing direction was extremely low. After completion of the jointing between silicon carbide and tungsten carbide-cobalt alloy, a medium-melting jointing material 10 comprising zinc-5% aluminum alloy was jointed in air at 400° C. to the face of the aluminum-1.3% manganese alloy of the high-melting jointing material 16 which had been jointed to the surface of the tungsten carbide-cobalt alloy. At this time, the zinc-aluminum alloy melted to break a strong oxide layer formed on the aluminum alloy, causing jointing. Thereafter, a ceramic member 14 comprising aluminum oxide (Al₂O₃) which had been metallized using nickel and gold was jointed to the medium-melting jointing material 20 which had been jointed to the other surface of the above-mentioned frame 15 through a solder 21 (60% lead-40% tin), thereby forming a sealing structure. The airtightness of the sealing structure thus obtained was measured with a helium leakage detector and found to be $10^{-8}$ Torr.l/s or less. Further, in order to separate the ceramic member 14, the sealing structure was heated at 180° C. at which the low-melting jointing material 21 melted. As a result, it was found that only the solder could be easily separated. The ceramic member 14 was easily rejoined with a solder.

EXAMPLE 6

Figure 10:
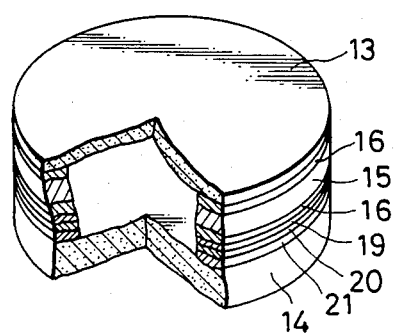
FIG. 10 is a partially cutaway perspective view of a further form of the sealing structure according to the present invention.

In the present example, a process for preparing a sealing structure using an intermediate material 19 will be described with reference to FIGS. 9 and 10.

A high-melting jointing material 16, as shown in FIG. 7, comprising a core material 17 comprised of an aluminum-1.3% manganese alloy and a skin material 18 comprised of aluminum-10% silicon-2% manganese was used as the high-melting jointing material to be interposed between a ceramic member 13 (70 mm in diameter×2 mm) comprised of silicon carbide and a frame 15 comprised of a tungsten carbide-cobalt alloy. A high-melting jointing material 16 as shown in FIG. 9 which had been provided on one side thereof with an intermediate member 19 comprised of pure aluminum (plate thickness: 1 mm) was used as the highmelting jointing material to be jointed to the other surface of the frame 15 comprising tungsten-cobalt alloy. These materials were assembled, heated and kept in vacuo (about $10^{-4}$ Torr) at 610° C. and a pressure of 0.2 kgf/mm² for 15 min. The resulting laminate was the same as that prepared in Example 5, except that the lowermost member located on the other surface of the frame 15 was an intermediate member 19 made of pue aluminum. The reason why the above-mentioed combination of the materials has been adopted is as follows. The use of both the highmelting jointing material 16 provided with a skin material 18 on both sides thereof and the high-melting jointing material 16 provided with a skin material 18 on one side thereof, an in Example 5, leads to not only the insertion thereof in a wrong place but also the loss of the face of the high-melting jointing material 16 having a structure as shown in FIG. 8, which brings about poor jointing. For this reason, the two high-melting jointing materials 16 having the same structure with each other, i.e., a structure as shown in FIG. 7, were used in order to prevent poor jointing. A medium-melting jointing material 20 comprised of zinc-5% aluminum alloy was jointed at 400° C. in air to the surface of the intermediate member 19 comprised of pure aluminum which had been jointed to the other surface of the frame 15 made of tungsten carbide-cobalt alloy. Thereafter, a ceramic member 14 comprised of aluminum oxide ($Al_2O_3$), which had been previously metallized with nickel and gold, was jointed to the medium-melting jointing material 20 with a low-melting jointing material comprised of solder 21 (60% Pb, 40% Sn), thereby obtaining a sealing structure. The sealing structure was applied to a helium leakage test. As a result, it was found that the sealing structure had an airtightness of $10^{-8}$ Torr.l/s or less. Further, it was found that the ceramic member 14 was easily separated and rejointed.

It is noted in this connection that, in jointing the ceramic member 13 to the frame 15, the additional incorporation of 0.1 to 5% of bismuth in aluminum-silicon-magnesium alloy as the skin material 18 brings about an improvement in wettability with the ceramic, which makes the jointing easier.

According to the present example, the sealing structure can be formed of a member which can be divided into three parts. Therefore, the projections for release of heat generated can be easily formed on silicon carbide having high thermal conductivity after the electronic components etc. are mounted. Further, since the sealing structure can be prepared by a simple combination of structural members, a semiconductor device can be prepared also with ease.

EXAMPLE 7

An example in which aluminum nitride (AlN) is used as the ceramic member 13 and an iron base metallic material is used as the frame 15 will be described with reference to FIG. 10.

A high-melting jointing material 16, as shown in FIG. 7, comprising a core material 17 comprised of an aluminum-1.3% magnanese alloy and a skin material 18 comprised of aluminum-10% silicon-2% manganese was used as the high-melting jointing material to be interposed between a ceramic member 13 (70 mm in diameter $\times$ 2 mm) comprised of aluminum nitride (AlN) and a frame 15 comprised of carbon steel. A high-melting jointing material 16 as shown in FIG. 9, which had been provided on one side thereof with an intermediate member 19 comprised of pure aluminum (plate thickness: 1 mm), was used as the high-melting jointing material to be jointed to the other surface of the frame 16 comprised of carbon steel. These materials were assembled, heated and kept in vacuo (about $10^{-4}$ Torr) at 610° C. and a pressure of 0.2 kgf/mm$^2$ for 5 min. Subsequently, a medium-melting jointing material 20 comprised of zinc-5% aluminum alloy was jointed at 400° C. in air to the surface of the intermediate member 19 comprised of pure aluminum which had been jointed to he other surface of the frame 15 comprised of carbon steel. Thereafter, a ceramic member 14 comprised of aluminum oxide ($Al_2O_3$), which had been previously metallized with nickel and gold, was jointed to he medium-melting jointing material 20 with a low-melting jointing material comprised of solder 21 (60% Pb, 40% Sn), thereby obtaining a sealing structure. The sealing structure was applied to a helium leakage test. As a result, it was found that the sealing structure had an airtightness of $10^{-8}$ Torr.l/s or less. The carbon steel used as the frame 15 and aluminum or aluminum alloy often form a thick intermetallic compound layer. Therefore, a further improved airtightness can be attained by preventing the formation of the intermetallic compound layer through a pretreatment of the jointing area of the carbon steel, such as chromization or plating with gold or silver.

In the present example, the same effect as that attained in Examples 5 and 6 can be obtained. Particularly, according to Examples 5 to 7, one side of the frame was jointed to one of the ceramic members with a high-melting jointing material comprised of aluminum or aluminum alloy, while the other side of the frame was jointed to a high-melting jointing material comprised of aluminum or aluminum alloy. Further, a medium-melting jointing material comprised of zinc or zinc-aluminum base alloy is jointed thereto, followed by the jointing between the medium-melting jointing material and the other ceramic member with a low-melting jointing material comprised of a solder. The above-mentioned process eliminates the need for use of an intermediate material having excellent solderability, requires no metallizing treatment for the frame, enables the sealing structure to be prepared through the same steps even when the sealing structure is prepared from a complex combination of structural members, and makes it possible to separate the ceramic member and rejoint it, which leads to easy repair and replacement of electric components contained in the sealing structure.

What is claimed is:

1. A sealing structure comprising a first board made of a material selected from the group consisting of ceramics and metals, a second board also made of a material selected from the group consisting of ceramics and metals, and a jointing member which seals the peripheral space between said first and second boards,
wherein said jointing member comprises a first layer selected from the group consisting of an aluminum layer and an aluminum base alloy layer, a second layer having a melting point lower than that of said first layer, and a solder layer having a melting point lower than that of said second layer.

2. A sealing structure according to claim 1, wherein said first layer has a multilayer structure comprising an aluminum layer and an aluminum base alloy layer.

3. A sealing structure according to claim 1, which comprises said first board made of a ceramic and, superimposed in the following order, said first layer, said second layer, said solder layer and said second board made of a metal.

4. A sealing structure according to claim 3, wherein said first layer comprises a multilayer structure comprised of an aluminum-silicon base alloy layer provided on the side of said first board and a pure aluminum layer provided on the side of said second layer, a pure aluminum layer, or an aluminum base alloy layer, and wherein said second layer comprises a material selected from the group consisting of zinc, zinc base alloy, magnesium, and magnesium base alloy.

5. A sealing structure according to claim 4, wherein said first board comprises a material selected from the group consisting of silicon carbide, sialon, silicon nitride, aluminum nitride, aluminum oxide, mullite, and beryllium oxide, and wherein said second board comprises a material selected from the group consisting of iron, molybdenum, tungsten, copper, and hard metals.

6. A sealing structure comprising a first board made of a material selected from the group consisting of ceramics and metals, a second board also made of a material selected from the group consisting of ceramics and metals, a metallic frame located in the pepripheral space between said first and second boards, a first jointing member which seals a peripheral space between said frame and said first board, and a second jointing member which seals a peripheral space between said frame and said second board,
wherein said first jointing member comprises at least a first layer selected from the group consisting of an aluminum layer and an aluminum alloy layer, a second layer having a melting point lower than that of said first layer, and a solder layer having a melting point lower than that of said second layer.

7. A sealing structure according to claim 6, wherein said second jointing member and said first layer each comprise a core material comprised of a layer made of a material selected from aluminum and aluminum base alloy and an aluminum-silicon base alloy layer formed thereon.

8. A sealing structure according to claim 7, wherein said second layer comprises a material selected from the group consisting of zinc, zinc base alloy, magnesium, and magnesium base alloy.

9. A sealing structure according to claim 6, wherein said first layer comprises a multilayer structure comprised of an aluminum layer and an aluminum base alloy layer.

10. A method of soldering at least two members selected from the group consisting of ceramics and metals,
which comprises heat jointing aluminum and/or aluminum alloy to one of said two members, heat jointing a material selected from the group consisting of zinc, zinc alloy, magnesium, and magnesium alloy to the surface of said aluminum and/or aluminum alloy, and soldering the other member thereto.

11. A method according to claim 10, wherein said one of the members is a ceramic, and the other member is a metal.

12. A method according to claim 11, wherein said material which is heat jointed to the surface of said aluminum and/or aluninum alloy is a zinc-aluminum base alloy.

13. A method according to claim 12, whereins aid aluminum base alloy layer is in the form of a sheet comprising a core material made of pure aluminum or an aluminum base alloy and a skin material made of an aluminum-silicon base alloy formed on both sides thereof.

14. A method according to claim 13 wherein said sheet is formed by applying or spraying powder of an aluminum-silicon base alloy on the surface of pure aluminum or aluminum alloy.

15. A method according to claim 13 wherein said core material is provided with a skin material comprised of an aluminum-silicon base alloy formed on one side thereof, and wherein said ceramic is jointed to said skin material comprised of an aluminum-silicon base alloy.

16. A method according to claim 12, wherein said ceramic, aluminum or aluminum alloy and zinc or zinc-aluminum base alloy are assembled, followed by jointing through heating at a temperature above the solidus temperature of said aluminum or aluminum alloy, or zinc or zinc-aluminum base alloy whichever has a higher solidus temperature.

17. A method according to claim 11, which comprises jointing said ceramic to said aluminum or aluminum base alloy heating said aluminum or aluminum base alloy at a temperature above the solidus temperature of said aluminum or aluminum base alloy and jointing said aluminum or aluminum base alloy to zinc or a zinc-aluminum base alloy by heating the zinc or zinc-aluminum base alloy at a temperature above the solidus temperature of the zinc or zinc-aluminum base alloy, followed by soldering of said metal.

18. A method according to claim 11, wherein said aluminum base alloy is used in the form of a sheet or powder.

19. A process for preparing a sealing structure comprising two ceramic members opposed to each other and a frame which has been jointed to each of said ceramic members,
which comprises a step of jointing one of said two ceramic members to one side of said frame with a first high-melting jointing material and jointing a second high-melting jointing material to the other side of said frame, a step of jointing a medium-melting jointing material which melts at a lower temperature than said first and second high-melting jointing materials to the surface of said second high-melting jointing material which has been jointed to the other side of said frame, and a step of jointing said medium-melting jointing material to the other ceramic member of said two ceramic members opposed to each other with a low-melting jointing material which melts at a lower temperature than said medium-melting jointing material, wherein said first and second high-melting jointing materials each comprise aluminum and/or aluminum base alloy, and wherein said medium-melting jointing material comprises a material selected from the group consisting of zinc, zinc base alloy, magnesium, and magnesium base alloy.

20. A process according to claim 19, wherein said low-melting jointing material comprises a solder, and wherein said ceramic members each comprise a material selected from the group consisting of silicon carbide, sialon, silicon nitride, aluminum nitride, aluminum oxide, mullite, and beryllium oxide.

21. A process according to claim 20, wherein one of said ceramic members comprises a material selected from the group consisting of silicon carbide, aluminum nitride, and beryllium oxide, wherein the other ceramic member comprises a material selected from the group consisting of aluminum and mullite, and wherein said frame comprises a metallic material or ceramic material.

22. A process according to claim 21 wherein said metallic material is a member selected from the group consisting of iron, iron base alloy, molybdenum, molybdenum base alloy, tungsten, tungsten base alloy and hard metals.

23. A process according to claim 22 wherein said hard metal is a member selected from the group consisting of tungsten carbide-cobalt alloy, tungsten carbide-nickel alloy, and tungsten carbide-copper alloy.

24. A process for preparing a sealing structure comprising two ceramic members opposed to each other and a frame which has been jointed to each of said ceramic members, which comprises a step of jointing one of said two ceramic members to one side of said frame with a first high-melting jointing material and jointing a second high-melting jointing material to the other side of said frame, a step of jointing a medium-melting jointing material which melts at a lower temperature than said first and second high-melting jointing materials to the surface of said second high-melting jointing material which has been jointed to the other side of said frame, and a step of jointing said medium-melting jointing material to the other ceramic member of said two ceramic members opposed to each other with a low-melting jointing material which melts at a lower temperature than said medium-melting jointing material, wherein said first and second high-melting jointing materials each comprise a core material comprised of aluminum or aluminum base alloy and a skin material comprised of an aluminum-silicon base alloy provided on both sides thereof.

25. A process according to claim 24, wherein said aluminum-silicon base alloy is aluminum-silicon-magnesium alloy or aluminum-silicon-magnesium-bismuth alloy.

26. A process according to claim 21 wherein said ceramic material is a member selected from the group consisting of silicon carbide, aluminum nitride, silicon nitride, sialon, aluminum oxide, and zirconium oxide.

27. A process according to claim 20 wherein said second high-melting jointing material is jointed to said medium-melting jointing material through an intermediate member having a melting temperature higher than that of said high-melting jointing material and interposed therebetween.

28. A process according to claim 27 wherein said intermediate member comprises an iron base material, aluminum base material or copper base material.

29. A process according to claim 24 wherein said second high-melting jointing material is jointed to said medium-melting jointing material through an intermediate member having a melting temperature higher than that of said high-melting jointing material and interposed therebetween.

30. A process according to claim 29 wherein said intermediate member comprises an iron base material, aluminum base material or copper base material.

31. A process for preparing a sealing structure comprising two ceramic members opposed to each other and a frame which has been jointed to each of said ceramic members, which comprises a step of jointing one of said two ceramic members to one side of said frame with a first high-melting jointing material and jointing a second high-melting jointing material to the other side of said frame, a step of jointing a medium-melting jointing material which melts at a lower temperature than said first and second high-melting jointing materials to the surface of said second high-melting jointing material which has been jointed to the other side of said frame, wherein said second high-melting jointing material is jointed to said medium-melting jointing material through an intermediate member comprising an iron base material, aluminum base material or copper base material, said intermediate member having a melting temperature higher than that of said high-melting jointing material, and a step of jointing said medium-melting jointing material to the other ceramic member of said two ceramic members opposed to each other with a low-melting jointing material which melts at a lower temperature than said medium-melting jointing material.

* * * * *